United States Patent [19]

Dearnaley et al.

[11] Patent Number: 6,159,533
[45] Date of Patent: *Dec. 12, 2000

[54] METHOD OF DEPOSITING A CATALYST ON A FUEL CELL ELECTRODE

[75] Inventors: Geoffrey Dearnaley; James H. Arps, both of San Antonio, Tex.

[73] Assignee: Southwest Research Institute, San Antonio, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/927,739

[22] Filed: Sep. 11, 1997

[51] Int. Cl.⁷ ...................................................... B05D 5/12
[52] U.S. Cl. ........................... 427/115; 427/566; 429/40; 429/41; 29/623.5
[58] Field of Search .................................... 427/115, 250, 427/252, 229, 294; 204/283, 294, 295, 290 R; 429/40, 44; 29/623.5; 422/566, 591, 592, 593, 595

[56] References Cited

U.S. PATENT DOCUMENTS

| | | |
|---|---|---|
| 3,291,753 | 12/1966 | Thompson . |
| 3,413,152 | 11/1968 | Folkins et al. . |
| 3,423,247 | 1/1969 | Darland, Jr. et al. . |
| 4,459,341 | 7/1984 | Marchant et al. . |
| 4,460,660 | 7/1984 | Kujas ........................................ 429/40 |
| 4,526,774 | 7/1985 | Maas, Jr. et al. ................... 423/573 R |
| 4,551,220 | 11/1985 | Oda et al. . |
| 4,795,656 | 1/1989 | Mizoguchi et al. . |
| 4,876,115 | 10/1989 | Raistrick . |
| 4,931,152 | 6/1990 | Naik et al. . |
| 5,068,126 | 11/1991 | Suzuki et al. . |
| 5,084,144 | 1/1992 | Reddy et al. ........................... 205/104 |
| 5,151,334 | 9/1992 | Fushimi et al. . |
| 5,192,523 | 3/1993 | Wu et al. . |
| 5,284,571 | 2/1994 | Verbrugge . |
| 5,296,274 | 3/1994 | Movchan et al. . |
| 5,316,871 | 5/1994 | Swathirajan et al. . |
| 5,336,570 | 8/1994 | Dodge, Jr. . |
| 5,393,572 | 2/1995 | Dearnaley et al. . |
| 5,458,989 | 10/1995 | Dodge . |
| 5,512,330 | 4/1996 | Dearnaley . |
| 5,518,831 | 5/1996 | Tou et al. ................................. 429/42 |
| 5,593,719 | 1/1997 | Dearnaley et al. . |
| 5,605,714 | 2/1997 | Dearnaley et al. . |
| 5,624,718 | 4/1997 | Dearnaley . |
| 5,635,041 | 6/1997 | Bahar et al. . |
| 5,725,573 | 3/1998 | Dearnaley et al. . |
| 5,731,045 | 3/1998 | Dearnaley et al. . |
| 5,750,013 | 5/1998 | Lin ..................................... 204/192.14 |
| 5,795,672 | 8/1998 | Dearnaley . |
| 5,879,827 | 3/1999 | Debe et al. . |
| 5,879,828 | 3/1999 | Debe et al. . |

OTHER PUBLICATIONS

Deposition Technologies for Films and Coatings, pp. 170–171, 1982.

Bunshah et al., "Deposition Technologies fro films and coatings developments and applications", Coating depostion by sputtering, pp. 170–171, Oct. 1983.

Masayuki Morita, et al., Anodic Oxidation of Methanol at a Gold–Modified Platinum Electrocatalyst Prepared by RF Sputtering on a Glassy Carbon Support, Electrochimica Acta., vol. 36. No. 5/6, pp. 947–951, No Month Available.

Nobuyoshi Nakagawa, et al., Electorde Reaction at Fixed Platinum Film—Fixation of Platinum Film on Stabilized–Zirconia Electrolyte abd its Effect on the Electode Performance of the Solid–Electrolyte Fuel Cell—, Journal of Chemical Engineering of Japan, vol. 25, No. 1, No Month Available 1992.

P.K. Srivastava, et al., Electrode supported solid oxide fuel cells: Electorlyte films prepared by DC magnetron sputtering, Solid State Ionics 99, pp. 311–319, No Month Available 1997.

Shinichi Hirano, et al., High performance proton exchange membrane fuel cells with sputter–deposited Pt layer electrodes, Electrochimica Acta. vol. 42, No. 10, pp. 1587–1593, No Month Available 1997.

Gerhard K. Wolf, et al., Ion Implated Catalysts for Fuel Cell Reactions, Nuclear Instrucments and Methods 209/210, pp. 835–840, No Month Available 1983.

Michael F. Weber, et al., Sputtered Fuel Cell Electrodes, J. Electrochemical Society: Electrochemical Science and Technology, vol. 134, No. 6, pp. 1416–1419, Jun. 1987.

E.J. Taylor, et al. "Preparation of High–Platinum–Utilization Gas Diffusion Electrodes for Proton–Exchange–Membrane Fuel Cells." *The Electrochem, Society, Inc.* vol. 139, No. 5 (May 1992).

Sanjeev Mukerjee, et al. "Effect of Sputtered Film of Platinum on Low Platinum Loading Electrodes on Electrode Kinetics of Oxygen Reduction in Proton Exchange Membrane Fuel Cells." *Electrochimica Acra,* vol. 38, No. 12, pp. 1661–1669, No Month Available (1993).

Browne, Malcom W., "Diamond Coating May be Future of Tool Manufacture," Article in San Antonio Express News (Apr. 1, 1996).

Sanjeev Mukerjee, et al. "Effects of Sputtered Fim of Platinum on Low Platinum Loading Electodes on Electrode Kinetics of Oxygen Reduction in Proton Exchange Membrane Fuel Cells", Electrochimica Acra, vol. 38. No. 12, pp. 1661–1669 (1993).

*Primary Examiner*—Brian K. Talbot
*Attorney, Agent, or Firm*—Paula D. Morris & Associates, P.C.

[57] ABSTRACT

Fuel cell electrodes comprising a minimal load of catalyst having maximum catalytic activity and a method of forming such fuel cell electrodes. The method comprises vaporizing a catalyst, preferably platinum, in a vacuum to form a catalyst vapor. A catalytically effective amount of the catalyst vapor is deposited onto a carbon catalyst support on the fuel cell electrode. The electrode preferably is carbon cloth. The method reduces the amount of catalyst needed for a high performance fuel cell electrode to about 0.3 mg/cm² or less.

11 Claims, No Drawings

METHOD OF DEPOSITING A CATALYST ON A FUEL CELL ELECTRODE

The U.S. Government has a paid-up license in this invention and the right in limited circumstances to require the patent owner to license others on reasonable terms as provided for by the terms of contract No. (or Grant No.) DE-AC08-96NV11986 awarded by the United States Department of Energy.

FIELD OF THE INVENTION

The present invention provides a process for depositing a minimal load of a catalyst (preferably platinum) onto a fuel cell electrode (preferably carbon cloth) while maximizing the catalytic activity of the catalyst.

BACKGROUND OF THE INVENTION

A fuel cell is an electrochemical device in which electrical energy is generated by chemical reaction without altering the basic components of the fuel cell—that is, the electrodes and the electrolyte. Fuel cells combine hydrogen and oxygen without combustion to form water and to produce direct current electric power. The process can be described as electrolysis in reverse. The fuel cell is unique in that it converts chemical energy continuously into electrical energy without an intermediate conversion to heat energy.

Fuel cells have been pursued as a source of power for transportation because of their high energy efficiency (unmatched by heat engine cycles), their potential for fuel flexibility, and their extremely low emissions. Fuel cells have potential for stationary and vehicular power applications; however, the commercial viability of fuel cells for power generation in stationary and transportation applications depends upon solving a number of manufacturing, cost, and durability problems.

One of the most important problems is the cost of the proton exchange catalyst for the fuel cell. Some of the most efficient catalysts for low temperature fuel cells are noble metals, such as platinum, which are very expensive. Some have estimated that the total cost of such catalysts is approximately 80% of the total cost of manufacturing a low-temperature fuel cell.

In a typical process, an amount of a desired noble metal catalyst in the range of from about 0.5–4 mg/cm$^2$ is applied to a fuel cell electrode in the form of an ink, or using complex chemical procedures. Unfortunately, such methods require the application of a relatively large load of noble metal catalyst in order to produce a fuel cell electrode with the desired level of electrocatalytic activity, particularly for low temperature applications. The expense of such catalysts makes it imperative to reduce the amount, or loading, of catalyst required for the fuel cell. This requires an efficient method for applying the catalyst.

In recent years, a number of deposition methods, including rolling/spraying, solution casting/hot pressing, and electrochemical catalyzation, have been developed for the production of Pt catalyst layers for proton exchange membrane (PEM) fuel cells. Although thin sputtered Pt coatings deposited on carbon cloth can measurably improve fuel cell performance, this approach generally is not considered to be viable for large area deposition or as a stand alone treatment for applying platinum. Continuing challenges remain in the development of scalable methods for the production of large-area (>300 cm$^2$), high performance (>1A/cm$^2$ at 0.6 V) fuel cell electrodes with low Pt loadings (<0.3 mg/cm$^2$).

SUMMARY OF THE INVENTION

The present invention provides a method for depositing a catalyst onto a carbon catalyst support for a fuel cell electrode. The method comprises vaporizing the catalyst in a vacuum to form a catalyst vapor. A catalytically effective amount of the catalyst vapor is deposited onto the carbon catalyst support

BRIEF DESCRIPTION OF THE INVENTION

Vacuum deposition techniques are routinely employed in a variety of applications ranging from metalized layers in the fabrication of semiconductors to barrier coatings for food packaging, hard coatings for cutting tools, and optical thin films. Some of the typical methods employed include chemical vapor deposition, physical vapor or thermal deposition, ion sputtering, and ion beam assisted deposition (IBAD). Because the materials are deposited in a vacuum (typically less than $1\times10^{-4}$ Torr), contamination of the films can be minimized while maintaining good control over film thickness and uniformity. Such techniques, in many cases, lend themselves to deposition of materials over large areas via a reel-to-reel or web coating processes.

The present invention uses vacuum deposition techniques to deposit a catalyst onto a suitable fuel cell electrode. An electrocatalytic coating may be formed on substantially any gas diffusion electrode using the processes of the present invention. The electrode material should resist corrosion in an acid environment, offer good electrical conductivity, allow fast permeation of oxygen (cathode) and hydrogen (anode), comply with thin layer manufacturing techniques, and contribute little to the weight and cost of the fuel cell assembly. Carbon is a preferred material, and suitable versions of carbon include, but are not necessarily limited to, graphite, carbon fiber, and carbon cloth. Suitable commercially available carbon electrode materials include, but are not necessarily limited to: carbon gas diffusion electrodes; iso-molded graphite; carbon bundles, preferably having 6,000 or 12,000 carbon filaments/bundle, reticulated carbon; carbon cloth; and, carbon paper. A preferred electrode material is a carbon cloth, preferably a carbon-only ELAT carbon cloth electrode, available from E-TEK, Natick, Mass.

Preferred electrodes are as thin as possible, typically having a thickness between about 0.010–0.175 inches. The electrode material preferably should be treated with a carbon catalyst support, such as carbon ink, using standard techniques well known in the art. Catalyzing and wet-proofing of the electrode material also is preferred before using the electrode materials.

In order to apply the electrocatalytic coating to the electrode, the electrode should be placed in a vacuum chamber provided with crucible, preferably made of graphite, with a mechanism for directing a high power electron beam onto a solid chunk of the catalyst to produce a catalyst vapor.

Suitable catalysts for use in the invention include, but are not necessarily limited to noble metal catalysts, such as platinum, gold, silver, palladium, ruthenium, rhodium, and iridium. A preferred catalyst is platinum. Where platinum is the catalyst, the catalyst is heated to between about 2300° C.–2600° C. (4172° F.–4712° F.) to form a vapor.

During the deposition process, the pressure in the vacuum chamber should be pumped down to a pressure sufficient to cause the vapor to condense onto the electrode. A preferred pressure is about $10^{-4}$ torr or less. As used herein, the term "in a vacuum" is defined to mean a pressure of about $10^{-4}$ torr or less. The vaporized catalyst preferably should be allowed to deposit or condense onto the electrode material in a vacuum. The temperature in the vacuum may vary; however, the temperature should be low enough not to damage the electrode material, and low enough to permit the catalyst vapor to condense onto the electrode material. Preferably, the temperature should be less than about 100–200° C. The deposition rate preferably should range from about 0.5–10Å/sec.

The deposition should continue until a catalytically effective amount of the catalyst is deposited onto the electrode. Typically, the amount of catalyst deposited should be in the range of from about 0.01 to about 0.3 mg/cm$^2$, preferably less than about 0.2 mg/cm$^2$. Because of the cost of the catalyst, the amount of catalyst deposited should be as small as possible while still resulting in enough active catalyst to catalyze the necessary proton exchange reactions. The thickness of the coating may be monitored by standard methods, e.g., using the frequency change of a quartz crystal oscillator. The weight of the film may be determined by weighing a known area of substrate material before and after depositing the film.

The present invention is capable of forming large-area (>300 cm$^2$), high performance (>1A/cm$^2$ at 0.6V) fuel cell electrodes with low Pt loadings (<0.3 mg/cm$^2$). In order to scale up the procedure, an entire roll of the electrode material may be placed in the vacuum chamber, deposited with the catalyst, and rerolled on a separate reel within the vacuum chamber. In a preferred embodiment, the electrode also is cooled as the catalyst is deposited, preferably by passage over the surface of a water cooled metal platen, fabricated from copper or aluminum, in order to maintain a surface temperature below about 80° C.

Electrodes made according to the present invention may be used in fuel cells having many different constructions. A preferred construction is a cylindrical fuel cell in which the electrodes are coupled with a proton exchange membrane. Suitable proton exchange membranes include, but are not necessarily limited to polymer electrolyte membranes or ionomers, such as NAFION™, available from Dupont, Inc., Wilmington, Delaware, and GORE-SELECT™ membranes, preferably a 20 µm GORE-SELECT™ membrane, available from W. L. Gore & Associates, Elkton, Md.

The invention will be better understood with reference to the following examples, which are for illustrative purposes only and should not be construed as limiting the invention, which is defined by the claims.

EXAMPLE I

Using a vacuum chamber 2 m long and 1.5 m in diameter, candidate coatings were first deposited on glass slides and small coupons of representative membrane and electrode material, and subjected to compositional and microstructural analysis. Next, a series of larger-area electrode materials were coated and evaluated using a small home-built test cell. After a final down-selection, a limited number of full scale 150 cm$^2$ electrodes were fabricated and tested. Special sample fixtures were developed to allow for the coating of carbon cloth electrodes over areas as large as 300 cm$^2$. Samples up to 250 cm$^2$ were coated using a planetary gear arrangement. The samples were asynchronously rotated through an electron beam-plasma vapor deposition (EB-PVD) coating flux to ensure uniform deposition of the Pt over the entire electrode surface.

Carbon cloth and carbon paper materials, both plain and wet-proofed (i.e. TEFLONIZED), were coated with 0.01, 0.05, and 0.10 mg/cm$^2$ of Pt. In addition, wet-proofed samples treated with a layer of carbon-only ELAT were procured from E-TEK for Pt coating in a similar manner.

A comparison of the thicknesses, morphologies, and Pt distributions of selected fuel cell electrode materials was performed using scanning electron microscopy (SEM) and transmission electron microscopy (TEM). The objective of such measurements was to determine the effect of electrode structure on the resulting efficiency of the fuel cell.

Performance analysis of catalyst coated electrode materials was undertaken using a small "home-built" test cell. The simple test cell consisted of two 6.9 cm stainless steel flanges used as collector plates with single air/hydrogen inlets and pairs of 100-mesh stainless steel screens mounted on each side of the electrode to provide a degree of gas diffusion. The cell active area was approximately 64 cm$^2$ and the same electrode material was used for both the anode and the cathode. The system was pressurized with humidified hydrogen and compressed air at 14 psig and a flow rate of ~0.5 liters per minute. Current-voltage tests were conducted at ambient temperature at each outlet.

In all tests, the EB-PVD Pt-coated ELAT material repeatedly demonstrated superior behavior compared to a higher loaded control material, namely E-TEK platinum over VULCAN XC-72 ELAT solid polymer electrolyte electrode (4 mg/cm$^2$). Measurable improvements in efficiency were observed for the carbon cloth with increasing Pt loading. It was also possible to further reduce the Pt loading of the EB-PVD coated carbon-only material on the anode side to as low as 0.01 mg/cm$^2$ with minimal reduction in performance.

EXAMPLE II

Fabrication and testing of three full scale 150 cm$^2$ electrodes was performed based on the results of the screening tests with the small test fixture. The electrodes prepared for testing are summarized in Table 2.

TABLE 2

| Sample I.D. | Membrane/ Electrode Material | Deposition Method | Pt Loading (mg/cm$^2$) (Anode/Cathode) |
| --- | --- | --- | --- |
| 1 | 20 µm Gore/ C-only ELAT | EB-PVD Pt | 0.10/0.01 |
| 2 | 50 µm Gore/ C-only ELAT | EB-PVD Pt | 0.05/0.05 |
| 3 | 20 µm Gore/ C paper | Sputtered Pt-C | 0.10/0.10 |

In order to effectively evaluate the full-scale electrodes, a Scribner Associates Model 890 load system was leased for use with a test fixture. Basically, the test fixture consisted of the chosen membrane sandwiched by the chosen electrodes surrounded by graphite plates having flow channels to allow the passage of hydrogen and oxygen gas into contact with the electrodes. A metal plate sandwiched the assembly on each side. The metal plates had suitable holes drilled for introducing the hydrogen and oxygen gas, and electrical leads collected current and connected each plate to the load unit. The 1 kW, 125 amp Scribner load unit recorded all performance data from the cell while controlling the temperatures of the cell and feed gases, ensuring consistent, repeatable results. The comparison test fixture was rated at more than 100 watts depending on the configuration and operational mode. The modular design of the cell allowed for many different possible configurations and use of different material thicknesses.

Particular attention was paid to the gas handling system in assembling the test cell. All of the tubing and connectors were made of a 316 stainless steel and TEFLON (where electrical isolation was needed) in an effort to limit transport of metal cations into the cell. The gases were passed through a pair of Perma Pure Inc. NAFION-based humidifiers and then carried to the cell via stainless tubing wrapped in heater tape to maintain proper temperature. Next, each gas was directed into 3-branch manifolds for the gas inlets and outlet. Exhaust gases were passed through a pair of flowmeters to measure the amount of excess fuel and air flow. Flowmeters were not installed on the upstream side as they contain a significant amount of aluminum parts which may contaminate the gases and hinder cell performance. A stainless steel reservoir with a built in heater was used to heat the cell and was controlled by the Scribner load unit. A plastic submersible chemical pump circulated deionized water in a closed circuit composed of TEFLON tubing through the cell and humidifiers and back to the container. No active cooling of the cell was needed.

Performance tests typically were conducted at a temperature of 60° C., 30 psi humidified gasses, 3.5 time Stoichiometric Ratio (SR) or less on the air side, and 2 SR or less on the reactant side. The first objective was to match the performance curves for the electrode of the present invention with the control, comprising a Gore PRIMEA membrane electrode assembly, under similar test conditions. After assembly, the cell was conditioned for several hours at low current. Once the performance stabilized, current voltage data was acquired starting at high currents and slowly ramping down.

Once the performance curve of the test membrane/electrode assembly had been matched with the performance curves of the controls, testing was performed. The cell was first conditioned for eight hours at a low current setting with humidified gasses at 30 psi. The highest current density achieved using the 100 nm/10 nm EB-PVD Pt-coated ELAT with the 20 μm membrane was 732 mA/cm$^2$ at 0.358 V. In general, the overall power output of EB-PVD deposited electrode was 10–50% less than the output of the control. However, it is important to point out that this performance was achieved with less than 20% of the total Pt loading of the baseline material.

The foregoing tests demonstrate successful use of EB-PVD in the fabrication of 150 cm$^2$ membrane electrode assemblies with total Pt loadings as low as 0.11 mg/cm$^2$.

Persons of ordinary skill in the art will recognize that many modifications may be made to the present invention without departing from the spirit and scope of the present invention. The embodiments described herein are meant to be illustrative only and should not be taken as limiting the invention, which is defined in the following claims.

We claim:

1. A method for making a fuel cell electrode, said method comprising:

providing a solid material consisting essentially of one or more noble metals;

thermally converting said solid material into a vapor; and depositing said vapor onto a gas permeable fuel cell electrode in an amount sufficient to produce a concentration of said noble metal adapted to produce a catalytically effective coating wherein, when said concentration comprises less than about 0.2 mg/cm$^2$, said coating generates about 1A/cm$^2$ at 0.6 V or more.

2. A method for making a fuel cell electrode, said method comprising:

providing a solid material consisting essentially of one or more noble metals;

thermally converting said solid material into a vapor; and depositing said vapor onto a support in an amount sufficient to produce a concentration of said noble metal adapted to produce a coating which is effective to catalyze the conversion of hydrogen and oxygen to water and electricity wherein, when said concentration comprises less than about 0.2 mg/cm$^2$, said electricity is about 1A/cm$^2$ at 0.6 V or more.

3. The method of claim 2 wherein said support is gas permeable.

4. The method of claim 2 wherein said support is a carbon catalyst support.

5. The method of claim 2 wherein said support is a carbon catalyst support.

6. The method of claim 4 wherein said carbon catalyst support comprises a material selected from the group consisting of graphite, a carbon filament bundle, reticulated carbon, carbon cloth, and carbon mesh.

7. The method of claim 4 wherein said carbon catalyst support comprises a material selected from the group consisting of a carbon cloth and a coating on a carbon cloth selected from the group consisting of carbon, a wet proofing material, and a combination thereof.

8. The method of claim 5 wherein said carbon catalyst support comprises a material selected from the group consisting of graphite, a carbon filament bundle, reticulated carbon, carbon cloth, and carbon mesh.

9. The method of claim 5 wherein said carbon catalyst support comprises a material selected from the group consisting of a carbon cloth and a coating on a carbon cloth selected from the group consisting of carbon, a wet proofing material, and a combination thereof.

10. The method of claim 7 wherein said wet proofing material is poly tetra-fluoroethylene.

11. The method of claim 9 wherein said wet proofing material is poly tetra-fluoroethylene.

* * * * *